US011060983B2

(12) United States Patent
Sudo et al.

(10) Patent No.: US 11,060,983 B2
(45) Date of Patent: Jul. 13, 2021

(54) EVALUATION METHOD OF SILICON WAFER

(71) Applicant: GlobalWafers Japan Co., Ltd., Niigata (JP)

(72) Inventors: Haruo Sudo, Niigata (JP); Nobue Araki, Niigata (JP); Kazuki Okabe, Niigata (JP); Koji Araki, Niigata (JP)

(73) Assignee: GLOBALWAFERS JAPAN CO., LTD., Niigata (JP)

( * ) Notice: Subject to any disclaimer, the term of this patent is extended or adjusted under 35 U.S.C. 154(b) by 0 days.

(21) Appl. No.: 16/957,612

(22) PCT Filed: Jul. 23, 2018

(86) PCT No.: PCT/JP2018/027425
§ 371 (c)(1),
(2) Date: Jun. 24, 2020

(87) PCT Pub. No.: WO2019/130633
PCT Pub. Date: Jul. 4, 2019

(65) Prior Publication Data

US 2021/0055232 A1 Feb. 25, 2021

(30) Foreign Application Priority Data

Dec. 25, 2017 (JP) ............................ JP2017-247117

(51) Int. Cl.
*G01N 21/95* (2006.01)
*G01N 21/21* (2006.01)
(Continued)

(52) U.S. Cl.
CPC ....... *G01N 21/9501* (2013.01); *G01B 11/168* (2013.01); *G01L 1/241* (2013.01);
(Continued)

(58) Field of Classification Search
CPC ....... G01B 11/16; G01B 11/168; G01B 11/18; G01B 11/24; G01L 1/241; G01L 5/0047;
(Continued)

(56) References Cited

U.S. PATENT DOCUMENTS 6,362,487 B1 * 3/2002 Ehlert ..................... C30B 33/00 250/458.1
6,794,635 B2 * 9/2004 Kuerner .................... G01J 4/04 250/225

(Continued)

FOREIGN PATENT DOCUMENTS

JP 2005292054 A 10/2005
JP 2015073049 A 4/2015
WO 2009102051 A1 8/2009

OTHER PUBLICATIONS

Muller, Timo et al., "Processing and Characterization of 300 mm Argon-Annealed Wafers," Solid State Phenomena, vols. 95-96, pp. 105-110. (Year: 2004).*

(Continued)

*Primary Examiner* — Gordon J Stock, Jr.
(74) *Attorney, Agent, or Firm* — Buchanan, Ingersoll & Rooney PC

(57) ABSTRACT

An evaluation method of a silicon wafer allows non-destructive and non-contact inspection of a slip that affects the electrical properties of semiconductor devices, without being subjected to restrictions of the surface condition of silicon wafers or processing contents as much as possible. The evaluation method of a silicon wafer includes a step of section analysis where a surface of a single crystal silicon wafer after thermal processing is divided by equally-spaced lines into sections with an area of 1 $mm^2$ or more and 25 $mm^2$ or less and the existence of strain in each of the sections is determined based on a depolarization value of polarized infrared light, and a screening step where the wafer is
(Continued)

evaluated as non-defective when the number of adjacent sections being determined to have strain by the section analysis step does not exceed a predetermined threshold value.

6 Claims, 12 Drawing Sheets

(51) Int. Cl.
*G01N 21/956* (2006.01)
*G01B 11/16* (2006.01)
*G01L 1/24* (2006.01)
*H01L 21/66* (2006.01)
*G01N 21/88* (2006.01)

(52) U.S. Cl.
CPC ........... *G01N 21/21* (2013.01); *G01N 21/956* (2013.01); *H01L 22/12* (2013.01); *G01N 2021/217* (2013.01); *G01N 2021/8848* (2013.01)

(58) Field of Classification Search
CPC ............. G01M 5/0033; G01M 5/0041; G01M 5/0091; H01L 22/12; H01L 22/20; H01L 22/24; H01L 21/324; H01L 21/3247; H01L 21/67288; G01N 21/21; G01N 21/23; G01N 21/88; G01N 21/9501; G01N 21/9503; G01N 21/9505; G01N 21/956; G01N 2021/217; G01N 2021/218; G01N 2021/4792; G01N 2021/8848; G01N 2021/8896
See application file for complete search history.

(56) References Cited

U.S. PATENT DOCUMENTS

| | | | | |
|---|---|---|---|---|
| 6,825,487 | B2 * | 11/2004 | Preece | G01N 21/21 250/559.4 |
| 7,639,348 | B2 * | 12/2009 | Niitsu | G01L 5/0047 356/33 |
| 2004/0206891 | A1 * | 10/2004 | Ma | G01N 21/8851 250/225 |
| 2011/0069313 | A1 * | 3/2011 | Sakai | G01N 21/9501 356/369 |
| 2012/0007978 | A1 * | 1/2012 | Passek | G01N 21/9503 348/87 |
| 2012/0229794 | A1 * | 9/2012 | Roberts | G01B 11/16 356/32 |
| 2012/0262715 | A1 * | 10/2012 | Sakai | G01L 1/241 356/369 |
| 2017/0089689 | A1 * | 3/2017 | Boyle | G06T 7/30 |
| 2020/0132548 | A1 * | 4/2020 | Furnas | G01N 33/386 |

OTHER PUBLICATIONS

International Search Report (with an English Translation) and Written Opinion issued in corresponding International Patent Application No. PCT/JP2018/027425, 6 pages. (dated Oct. 9, 2018).

* cited by examiner

| | Surface State of Wafers | Determination Results at Surface Inspection |
|---|---|---|
| ○ | After Mirror-polished | Non-defective |
| △ | After Mirror-polished | Defective |
| □ | Before Mirror-polishing | Not Measurable |

EVALUATION METHOD OF SILICON WAFER

TECHNICAL FIELD

The present invention relates to an evaluation method of a silicon wafer to be used for substrates of semiconductor devices.

BACKGROUND ART

For a silicon wafer to be used for a semiconductor device substrate, the formation of a defect-free layer is required that has no void defects called crystal originated particles (COP) on a surface or a surface layer where an active region of a semiconductor device is to be formed. As techniques responding to the above requirements, a batch-type heat-processing in which silicon wafers are processed at a temperature of not less than 1100° C. using a vertical furnace, and a rapid thermal process (RTP) are known.

A silicon wafer may plastically deform due to the occurrence of slips when thermal stress or bending stress is applied. A slip is an assembly of linear dislocation defects, and it may be a cause to affect the electric characteristics of semiconductor devices, depending on the extent of occurrence of the slip. Therefore, preventing outflow of nonconforming articles by inspecting of occurrence of the slip before shipping is necessary.

There exists a method of inspecting the slip occurrence that focuses on the fact that steps often appear on a silicon wafer surface when a slip occurs. Specifically, the inspection method is known that detects slip occurrence by detecting steps due to slip occurrence using a surface inspection apparatus, such as Surfscan SP2 manufactured by KLA-Tencor Corporation, which is used for final appearance inspection of wafers. Another method is also known that visualizes strain latent in a surface layer of a silicon wafer by thermal processing. (See Patent Literature 1)

CITATION LIST

Patent Literature

PTL 1: JP-A-2005-292054

Technical Problem

The surface inspection apparatus for final appearance inspection can be applied to inspection targeting mirror-polished wafers, but it is difficult to detect steps due to slip occurrence because the noise level is high in a state of the relatively coarse surface before mirror-polishing.

In addition, detection of a slip is difficult because the steps due to slip occurrence are smoothed by mirror-polishing of silicon wafers that are an object of inspection after thermal processing.

Thus, in the slip detection method using the surface inspection apparatus for final appearance inspection, there exists a technical problem that the usability depends on the surface state of silicon wafers or contents of processing to silicon wafers. In addition, the method that visualizes strain latent in a surface layer of a silicon wafer by thermal processing is a destructive inspection method in that wafers are thermally processed and is not applicable under the condition that thermal processing is not allowed.

As described above, the applicable condition of the conventional evaluation method for detecting slip occurrence is limited. Then, an evaluation method of a silicon wafer has been desired that allows non-destructive and non-contact inspection of slips that affect to electrical properties of semiconductor devices, without being subjected to restrictions of the surface condition of silicon wafers or processing contents as much as possible.

An object of the present invention made in view of the above described is to provide an evaluation method of a silicon wafer that allows non-destructive and non-contact inspection of a slip that affects to the electrical properties of a semiconductor device, without being subjected to restrictions of the surface condition of silicon wafers or processing contents as much as possible.

Solution to Problem

As a solution to the above-described problem, the evaluation method of a silicon wafer according to the present invention is characterized by the method including a step of section analysis and a step of screening. In the section analysis step, a surface of a single crystal silicon wafer after thermal processing is divided by equally-spaced lines into sections having an area not less than 1 $mm^2$ and not more than 25 $mm^2$ and the existence of strain in each of the sections is determined based on depolarization values of polarized infrared light, and in the screening step, a wafer is evaluated as non-defective when the number of adjacent sections being determined to have strain by the section analysis step does not exceed a predetermined threshold value.

The number of adjacent sections determined to have strain by the section analysis step is preferably defined as the total number of sections determined to have strain located in the front-back, left-right, and diagonal directions around the section determined to have strain.

The predetermined threshold value is preferably determined by in advance obtaining a relationship between a slip length evaluated using X-ray topography and the number of adjacent sections determined to have strain.

The determination whether strain exists based on depolarization values is preferably performed by using short-period components that are obtained by removing the long-period components from the measured depolarization values; the long-period components are extracted by smoothing the measured depolarization values.

The surface roughness Ra of the Si wafers is preferably not more than 0.1 μm.

The surface roughness Ra of the Si wafers is not less than 0.001 μm.

Advantageous Effect of Invention

The method according to the present invention allows non-destructive and non-contact inspection of a slip that affects the electrical properties of a semiconductor device, without being subjected to restrictions of the surface condition of silicon wafers or processing contents as much as possible.

DESCRIPTION OF EMBODIMENTS

An embodiment of an evaluation method of a silicon wafer according to the present invention will be described with reference to drawings. It should be noted that embodiments of the evaluation method of a silicon wafer according to the present invention are not restricted by the embodiments described below.

Example of Configuration of an Apparatus

As an apparatus to be used in an embodiment of the evaluation method of a silicon wafer according to the present invention, an infrared photoelasticity measuring device, also known as a scanning infrared depolarization (SIRD) device, can be employed. This strain measurement device utilizing infrared photoelasticity uses birefringence, photoelasticity, exhibited when polarized light passes through a stress-applied sample, and measures by digitizing stresses applied to the sample. When samples are silicon wafers, infrared light having high transmissivity against silicon is generally used.

Figure 1:
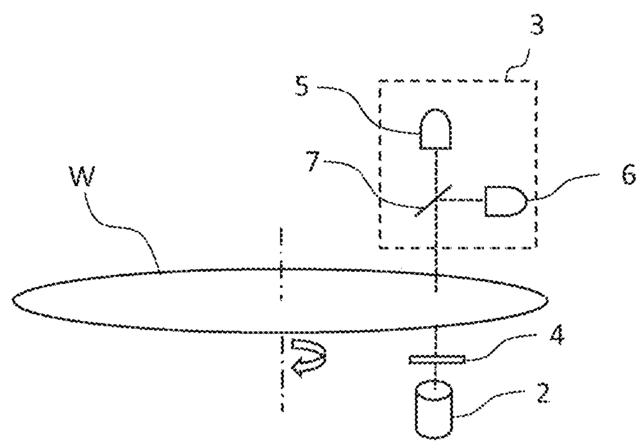
FIG. 1 illustrates the principle of an apparatus to be used in embodiments of the present invention.

FIG. 1 schematically explains the measurement principle of the infrared photoelasticity measuring device 1. As shown in FIG. 1, polarized infrared light emanating from an infrared laser device 2 passes through a silicon wafer W, is analyzed by an analyzing unit 3, and strain occurring in the wafer is measured.

A polarizer 4 is disposed between the infrared laser device 2 and the silicon wafer W such that polarized infrared light emanating from the infrared laser device 2 is configured to irradiate the silicon wafer W after passing the polarizer 4. Infrared light emanating from the infrared laser device 2 is polarized itself and the plane of polarization is precisely adjusted by allowing to pass through the polarizer 4.

The analyzing unit 3 includes two light-receiving elements 5 and 6, a polarizing beamsplitter 7. The polarizing beamsplitter 7 leads only polarized light having the same polarization plane that polarized light passing the polarizer 4 has to the light-receiving element 5 and leads only polarized light having a different polarization plane from that of polarized light passing the polarizer 4 to the light-receiving element 6.

Therefore, a ratio of light intensity detected by the light-receiving element 5 to light intensity detected by the light-receiving element 6 is an index indicating the degree of depolarization, a depolarization value, caused by transmission through the silicon wafer W. Because a portion on the silicon wafer W to which a stress is applied for shows photoelasticity, the depolarization values is an index indicating distribution of stress applied to the silicon wafer W.

Measurement Examples

Here, with reference to the drawings of FIG. 2 to FIG. 7, depolarization values measured by the infrared photoelasticity measuring device 1 and processing to visualize information on strain related to a slip from the depolarization values will be described.

Figure 2:
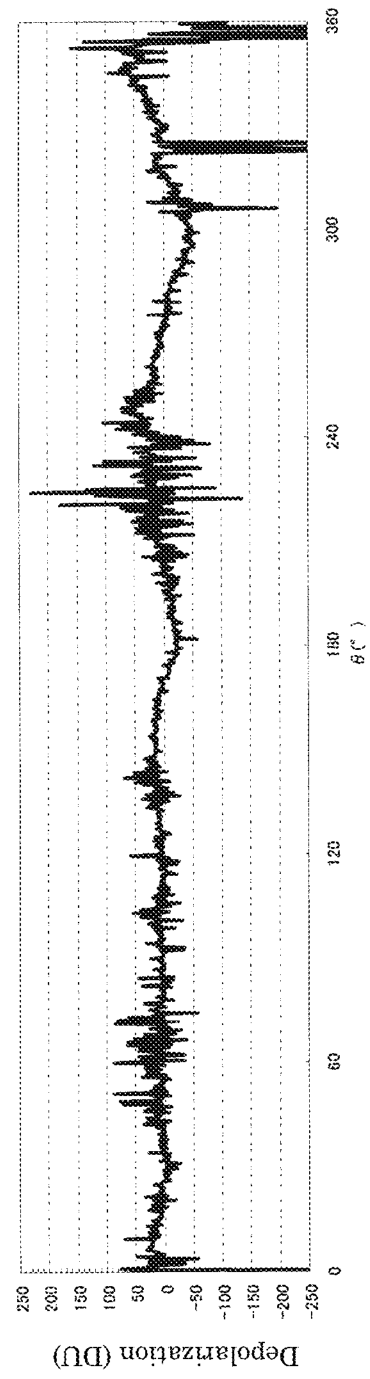
FIG. 2 is a graph showing an example of measured depolarization values.
Figure 3:
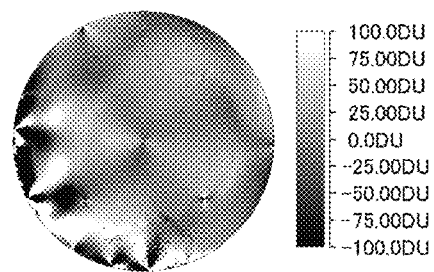
FIG. 3 is an example of a figure showing in-plane mapping of the measured depolarization values.

FIG. 2 is a graph showing an example of measured depolarization values, and FIG. 3 is an example of a figure showing an in-plane mapping of the measured depolarization values. As can be seen from FIG. 2 and FIG. 3, depolarization values measured themselves contain a long-period component and a short-period component. The long-period component is mainly due to the crystal structure and the short-period component is related to slip occurrence. Thus, in order to detect the slip occurrence more accurately, the short-period component is extracted from the measured depolarization values as shown below.

Figure 4:
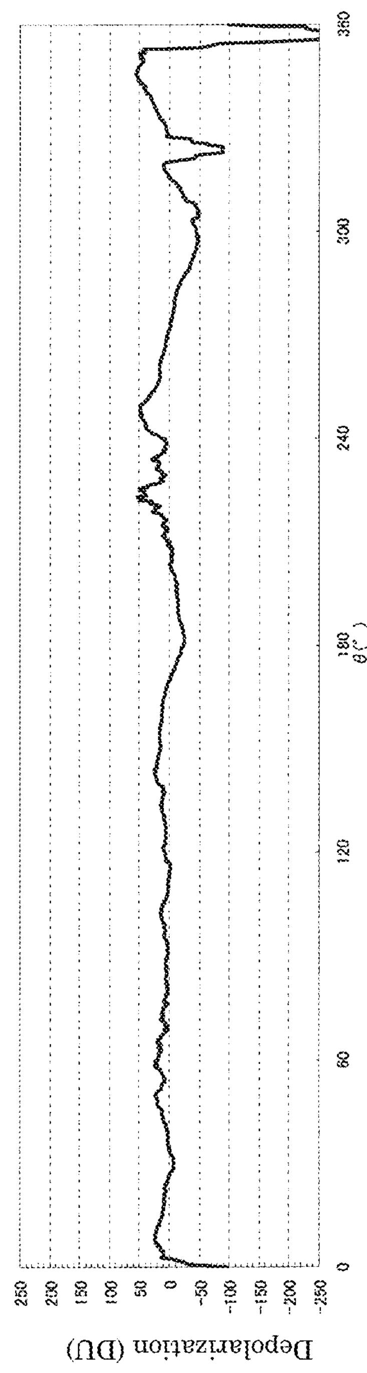
FIG. 4 is a graph showing a long-period component extracted by smoothing the depolarization values given in FIG. 2.
Figure 5:
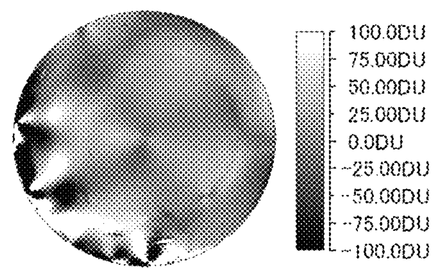
FIG. 5 is a figure showing in-plane mapping of long-period components extracted from the in-plane-mapped depolarization values shown in FIG. 3.

FIG. 4 is a graph showing a long-period component extracted by smoothing the depolarization values given in FIG. 2 and FIG. 5 is a figure showing the in-plane mapping of long-period components extracted from the in-plane-mapped depolarization values shown in FIG. 3. FIG. 4 and FIG. 5 show those obtained by smoothing processing of depolarization values shown in FIG. 2 and FIG. 3, respectively. The smoothing processing may be a floating-averaging processing, for example, and an interval of the floating-averaging processing is preferably set 0.5 mm to 4 mm.

Figure 6:
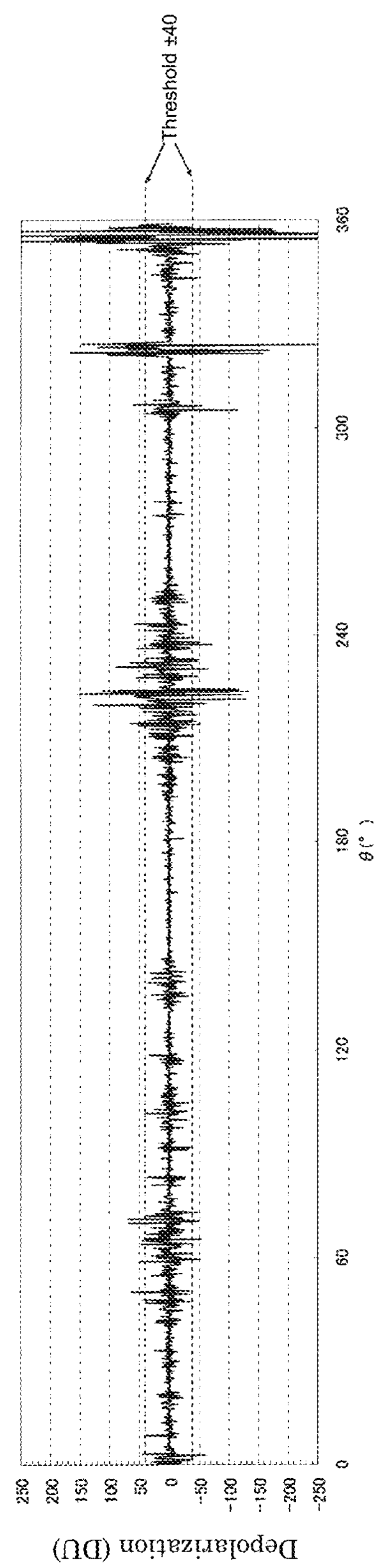
FIG. 6 is a graph showing a short-period component extracted by removing the long-period components from the depolarization values shown in FIG. 2.
Figure 7:
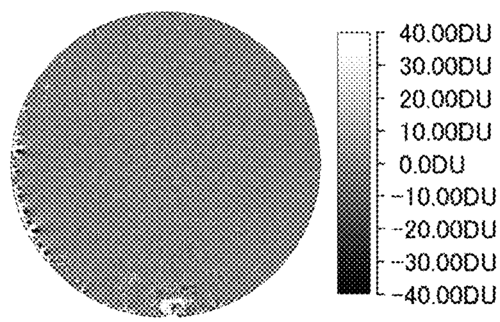
FIG. 7 is a figure showing in-plane mapping of short-period components extracted from the in-plane-mapped depolarization values shown in FIG. 3.

FIG. 6 is a graph showing a short-period component extracted by removing the long-period components from the depolarization values shown in FIG. 2, and FIG. 7 is a figure showing in-plane mapping of short-period components extracted from the in-plane-mapped depolarization values shown in FIG. 3. Specifically, FIG. 6 and FIG. 7 respectively show depolarization values that are obtained by removing long-period components shown in FIG. 4 and FIG. 5 from the depolarization values shown in FIG. 2 and FIG. 3.

As can be read from FIG. 6 and FIG. 7, the short-period component of the depolarization values has portions whose values significantly vary locally.

These portions correspond to positions where strain is large locally, and the position is determined to be as those where strain exists when the amplitude exceeds the predetermined threshold value, ±40 DU, for example.

In more detail, a surface of a silicon wafer is divided by equally-spaced lines into sections having an area not less than 1 $mm^2$ and not more than 25 $mm^2$; when the amplitude of the short-period component exceeds the predetermined threshold value in a section, it is determined that strain exists in the section.

Procedure of Evaluation

Figure 8:
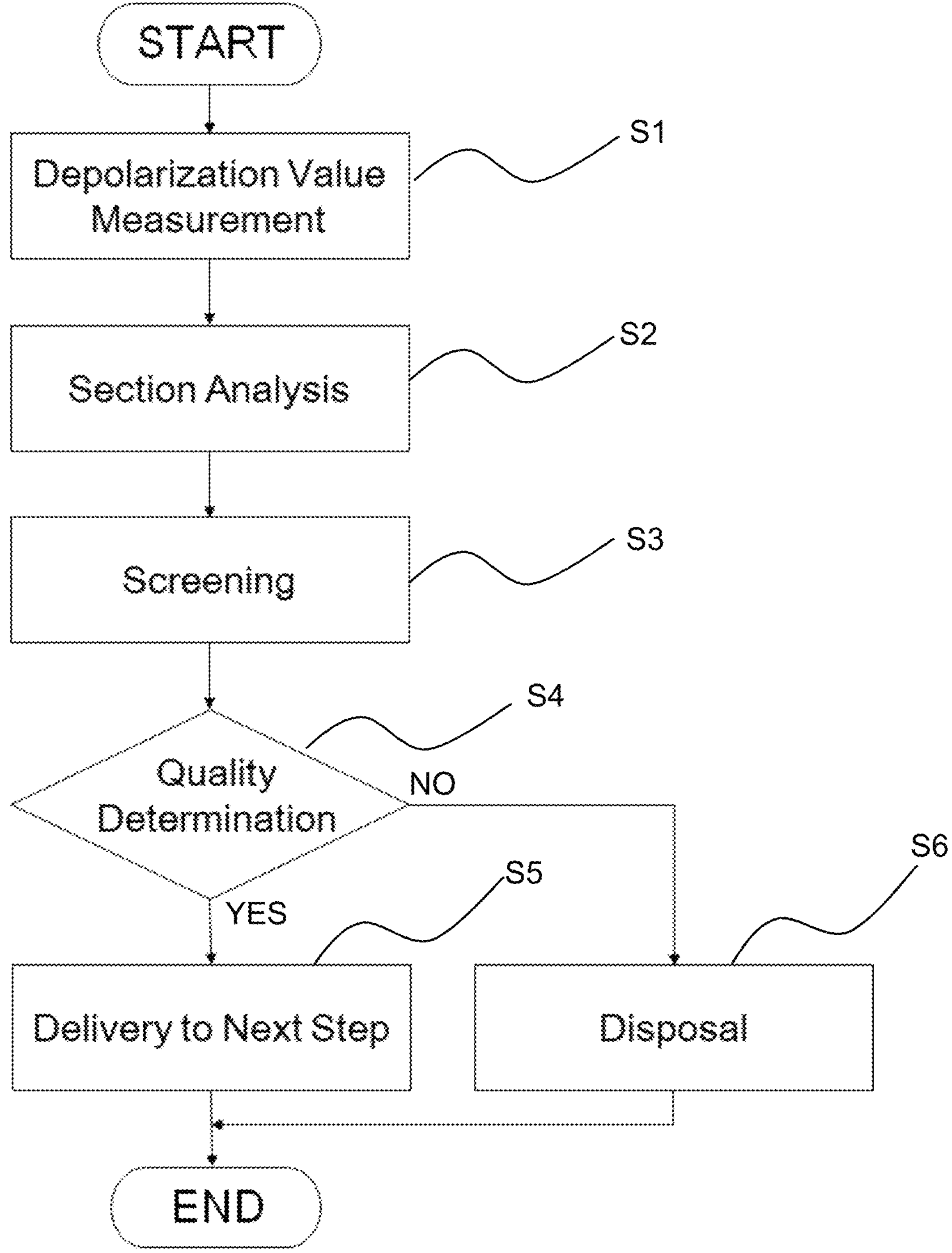
FIG. 8 is a flowchart showing the evaluation method of a silicon wafer as an embodiment according to the present invention.

The procedure of evaluation is described with reference to FIG. 8. FIG. 8 is a flowchart showing the evaluation method of a silicon wafer as an embodiment according to the present invention. The evaluation method of a silicon wafer shown in FIG. 8 is for the case of one wafer, but for the case of evaluating multiple wafers, the flow has only to be repeated as many times as the number of wafers.

The surface roughness Ra of a silicon wafer to be evaluated is preferably not less than 0.001 μm and no more than 0.1 μm. It is because a silicon wafer with a roughness Ra of not more than 0.1 μm has sufficient transmittance of polarized infrared light, and the surface roughness Ra of a silicon wafer before surface polishing is not less than 0.001 μm.

With such a surface roughness Ra, slip evaluation using a surface inspection apparatus cannot be properly carried out. However, the evaluation method of a silicon wafer according to an embodiment of the present invention can perform evaluation even when a surface roughness Ra is not less than 0.001 μm.

In the evaluation method of a silicon wafer, a depolarization value of the silicon wafer is measured in the first place (Step 1), as shown in FIG. 8. The measurement of the depolarization is carried out with the infrared photoelasticity measuring device 1. That is, stress applied to the silicon wafer is measured as a depolarization value, using birefringence, photoelasticity, that appears when polarized infrared light passes through the silicon wafer to which stress is applied.

Next, the section analysis of the silicon wafer is carried out (Step 2). In the section analysis, a surface of a single crystal silicon wafer thermally processed is divided by equally-spaced lines into sections having an area of not less than 1 $mm^2$ and not more than 25 $mm^2$, and existence of strain in each of the sections is determined based on depolarization values obtained by using the infrared photoelasticity measuring device 1.

Determination of the existence of strain based on depolarization values in the section analysis is preferably performed using a short-period component that is obtained by removing a long-period component from the depolarization values; the long-period component is extracted by smoothing the measured depolarization values.
It is because the measured depolarization values include a long-period component mainly due to crystal structure and a short-period component related to slip occurrence.

Then, screening of a silicon wafer is performed based on the presence or absence of strain in each section (Step 3). In this screening, a silicon wafer is determined as non-defective that has the adjacent number of sections being determined to have strain by the section analysis does not exceed the predetermined threshold value.

Figure 9:
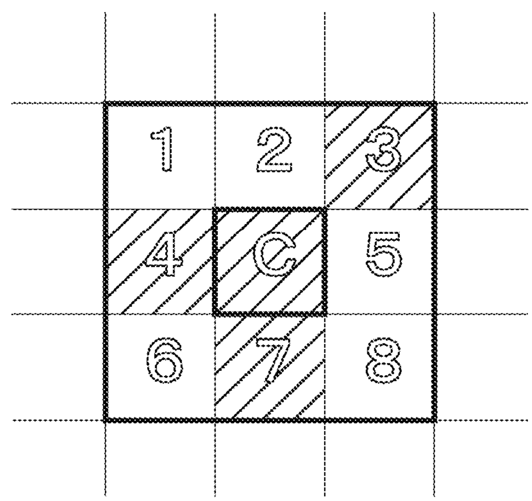
FIG. 9 shows an example of determination using the number of adjacent sections.

The number of adjacent sections determined to have strain is preferably defined as the total number of sections being determined to have strain located in the front-back, left-right, and diagonal directions around the section being determined to have strain. FIG. 9 shows an example of determination using the number of adjacent sections.

In equal-area square sections shown in FIG. 9, hatched sections represent that they are those that are determined to have strain. Supposing that let the section (C) that is determined to have strain be the center, surrounding sections are 8 sections (1 to 8) locating in left-right, front-back and diagonal directions. The number of adjacent sections in this case is defined to be the number of sections that are determined to have strain among eight sections (1 to 8). That is, in the example shown in FIG. 9, the number of adjacent sections is three (3) since three sections, i.e., section (3), section (4), and section (7), have strain.

The predetermined threshold value to be used for screening is preferably determined by in advance obtaining a relationship between slip length of a silicon wafer evaluated using X-ray topography and the number of adjacent sections determined to have strain.

As to be described by showing experimental examples later, the total number of adjacent sections obtained by the present evaluation method of a silicon wafer shows a good correlation relation with the slip length of silicon wafers evaluated using X-ray topography. Therefore, once the threshold value for the number of adjacent sections based on the slip length of silicon wafers evaluated in advance using X-ray topography is determined, evaluation of silicon wafers can be achieved with the equivalent accuracy without using X-ray topography.

Now returning to the reference of FIG. 8, the next step will be described. Based on whether a silicon wafer after the screening is non-defective, a decision is made whether the wafer is to be delivered to the next step (Step S4) accordingly. A wafer in which the number of adjacent sections does not exceed the predetermined value, six, for example, is determined as non-defective (YES), the silicon wafer determined as non-defective is delivered to the next step (Step S5). In contrast, a silicon wafer with the number of adjacent sections not less than the predetermined threshold value, six, for example, is determined to be defective (NO), and is discarded (Step S6).

Experiments for Verification of Effects

Figure 10:
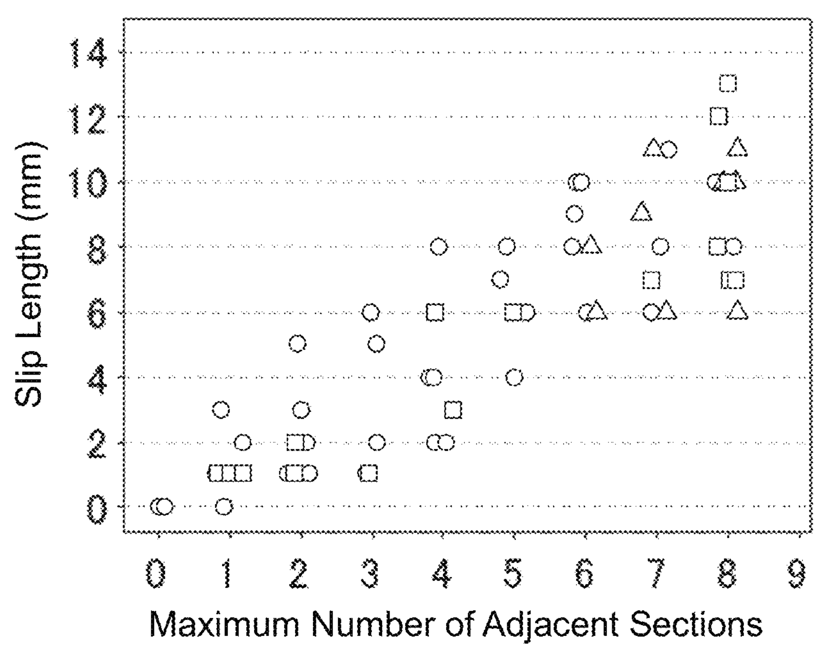
FIG. 10 is a graph showing a relationship between the maximum number of the adjacent sections and slip lengths.

Effects of the evaluation method of a silicon wafer according to the present invention will be described with reference to FIGS. 10 and 11. FIG. 10 is a graph showing a relationship between the maximum number of the adjacent sections and slip length, and FIG. 11 shows a typical in-plane map of a measurement example.

A sample used for the experiment for verification is a silicon wafer with a diameter of 300 mm having an oxygen concentration of $1.2\times10^{18}$ atoms/$cm^3$ and a nitrogen concentration of $3\times10^{14}$ atoms/$cm^3$. For the sake of comparison, silicon wafers before mirror-polishing and after mirror-polishing are used in the experiments, the surface roughness Ra of the wafer before mirror-polishing is 0.01 μm and the surface roughness Ra of the wafer after mirror-polishing is 0.0001 μm. The thermal treatment of rapid thermal oxidation (RTO) was performed at 1350° C. for 30 s.

Data plotted in FIG. 10, for samples that are before and after mirror polishing, show a comparison between the results obtained by the evaluation method according to the present invention and the slip length (in mm) measured by X-ray topography, that is, the maximum number of adjacent sections, and also show the results of the final appearance inspection using a surface inspection apparatus, Surfscan SP2 manufactured by KLA-Tencor. In the graph shown in FIG. 10, the horizontal axis is the maximum number of adjacent sections according to the present evaluation method and the vertical axis is the slip lengths obtained using X-ray topography. Differences due to samples and determination results by the surface inspection apparatus are indicated by different plotted symbols.

Symbols plotted of data in FIG. 10 represent that a symbol of circle "○" is corresponding to data for polished wafers that are determined as non-defective using the surface inspection apparatus, a symbol of triangle "Δ" is corresponding to data for polished wafers that are determined to be defective using the surface inspection apparatus, and a symbol of square "□" is corresponding to data for wafers before polishing and not measurable with the surface inspection apparatus because of a rough surface.

As shown in FIG. 10, there is a good correlation between the maximum number of the adjacent sections according to the embodiment of the present invention and slip lengths (in mm) obtained by X-ray topography, for both samples before and after polishing. This means that the evaluation method of a silicon wafer according to the present invention can properly screen slips occurring in silicon wafers with the equivalent accuracy to inspection using the X-ray topography even if a direct inspection is not performed using the X-ray topography.

As also applicable to a silicon wafer before mirror polishing, the method according to the embodiment of the present invention can be applied to a wider range of Si wafers than the range of silicon wafers to which the surface inspection apparatus, which are used for the conventional final appearance inspection, such as Surfscan SP2 manufactured by KLA-Tencor, can be applied.

Further, the data with the symbol "0" of samples that are determined as non-defective using the surface inspection apparatus contain data of samples having a longer slip length measured by X-ray topography. This indicates that, in the conventional slip detection method using the surface inspection apparatus used in final appearance inspection, defective products that should be eliminated may have been delivered to the next process. It is conceivable that the conventional slip inspection method using the surface inspection apparatus used in the final appearance inspection cannot detect slips that occur because steps due to slip are smoothed while mirror-polishing.

Meanwhile, the evaluation method of a silicon wafer according to the embodiment of the present invention has few inspection omissions even for mirror-polished because there is a good correlation between the maximum number of adjacent sections by the present method and the slip length (in mm) obtained by X-ray topography. The evaluation method of a silicon wafer according to the embodiment of the present invention can perform more accurate screening not only for wafers before mirror-polishing to which the surface inspection apparatus is not applicable but also mirror-polished wafers to which the surface inspection apparatus is applicable.

Figure 11A:
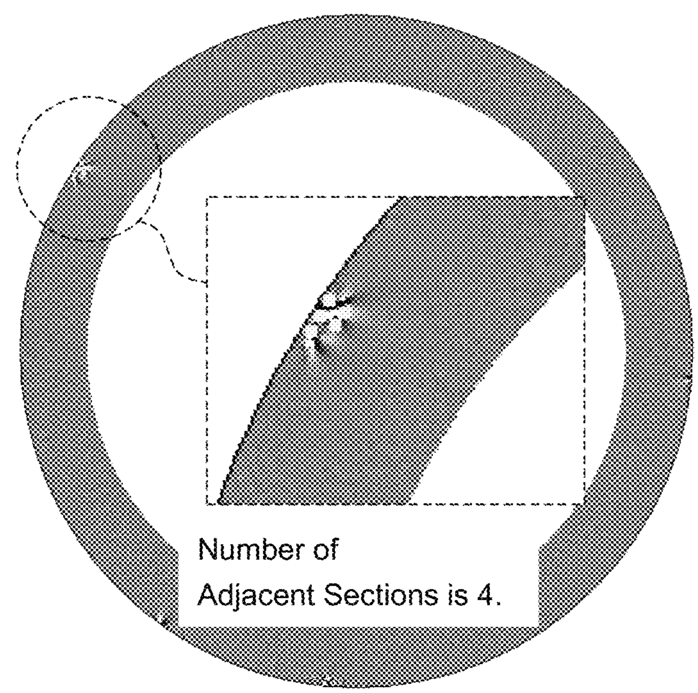
FIGS. 11A and 11B show a typical in-plane map of examples of measurements.
Figure 11B:
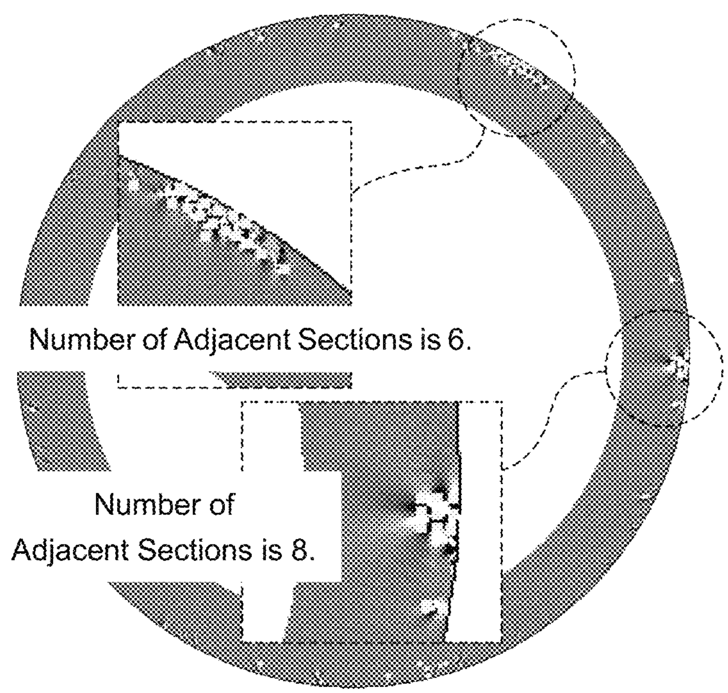

FIG. 11A is an in-plane map of a silicon wafer, to which an RTO processing is performed before mirror-polishing, obtained by applying the evaluation method of a silicon wafer according to an embodiment of the present invention. FIG. 11B is an in-plane map of a silicon wafer, to which an RTO processing is performed after mirror-polishing, obtained by applying the evaluation method of a silicon wafer according to the embodiment of the present invention.

As seen from FIGS. 11A and 11B, the evaluation method of a silicon wafer according to the embodiment of the present invention is applicable to any of silicon wafers before and after mirror-polishing.

In the examples of FIGS. 11A and 11B, the reason why positions at which strain occurs concentrate to an outer periphery of the silicon wafers is conceivable that wafer-held portions when an RTO processing was performed are generation sources of strain.

The evaluation method of a silicon wafer of according to the embodiment of the present invention allows non-destructive and non-contact inspection of a slip that affects the electrical properties of semiconductor devices, free from restrictions of the surface condition of silicon wafers or processing contents as much as possible. The evaluation method of a silicon wafer according to the embodiment of the present invention can properly screen a slip occurring in a silicon wafer with the equivalent accuracy to inspection using the X-ray topography even if a direct inspection is not performed using the X-ray topography. Further, the evaluation method of a silicon wafer according to the embodiment of the present invention can perform more accurate screening not only for wafers before mirror-polishing to which the surface inspection apparatus is not applicable but also mirror-polished wafers to which the surface inspection apparatus is applicable.

The present invention has been described based on an embodiment but is not restricted by the above embodiment.

LIST OF REFERENCE NUMERALS

1 an infrared photoelasticity measuring device
2 an infrared laser device
3 an analyzing unit
4 a polarizer
5, 6 a light-receiving element
7 a polarizing beamsplitter

The invention claimed is:

1. An evaluation method of a silicon wafer, comprising:

a step of section analysis where a surface of a single crystal silicon wafer after thermal processing is divided by equally-spaced lines into sections having an area of not less than 1 $mm^2$ and not more than 25 $mm^2$ and presence of strain in each of the sections is determined based on a depolarization value of polarized infrared light; and a screening step where the wafer is evaluated as non-defective when the number of adjacent sections that are determined to have strain by the section analysis step does not exceed a predetermined threshold value.

2. The evaluation method of a silicon wafer in claim 1, wherein the number of adjacent sections that are determined to have strain is defined as a total number of sections that are determined to have strain located in front-back, left-right, and diagonal directions around a section that is determined to have strain.

3. The evaluation method of a silicon wafer in claim 1, the predetermined threshold value is determined by in advance obtaining a relation between a slip length of the silicon wafer that is evaluated using X-ray topography and the number of adjacent sections that are determined to have strain.

4. The evaluation method of a silicon wafer in claim 1, wherein determination whether strain exists based on the depolarization value is made by using a short-period component that is obtained by removing a long-period component from the measured depolarization value; the long-period component is extracted by smoothing the measured depolarization value.

5. The evaluation method of a silicon wafer in claim 1, wherein a surface roughness Ra of the silicon wafer is not more than 0.1 μm.

6. The evaluation method of a silicon wafer in claim 5, wherein a surface roughness Ra of the silicon wafer is equal not less than 0.001 μm.

* * * * *